(12) United States Patent
Kishimoto

(10) Patent No.: US 11,758,774 B2
(45) Date of Patent: *Sep. 12, 2023

(54) ORGANIC EL DISPLAY APPARATUS WITH SUPPRESSED COLOR AND/OR LUMINANCE NON-UNIFORMITY AND METHOD OF MANUFACTURING ORGANIC EL DISPLAY APPARATUS

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 11 days.

This patent is subject to a terminal disclaimer.

(21) Appl. No.: 17/394,339

(22) Filed: Aug. 4, 2021

(65) Prior Publication Data

US 2021/0367018 A1    Nov. 25, 2021

Related U.S. Application Data

(62) Division of application No. 16/767,449, filed as application No. PCT/JP2018/012906 on Mar. 28, 2018, now Pat. No. 11,114,517.

(51) Int. Cl.
*H10K 59/124* (2023.01)
*H10K 59/121* (2023.01)
(Continued)

(52) U.S. Cl.
CPC ....... *H10K 59/124* (2023.02); *H10K 59/1213* (2023.02); *H01L 27/1222* (2013.01);
(Continued)

(58) Field of Classification Search
None
See application file for complete search history.

(56) References Cited

U.S. PATENT DOCUMENTS

| 11,114,517 B2 * | 9/2021 | Kishimoto ..........  H01L 27/3262 |
| 2002/0036462 A1 | 3/2002 | Hirano |

(Continued)

FOREIGN PATENT DOCUMENTS

| JP | H08-306954 A | 11/1996 |
| JP | 2001-291595 A | 10/2001 |

(Continued)

*Primary Examiner* — Nduka E Ojeh
(74) *Attorney, Agent, or Firm* — ScienBiziP, P.C.

(57) ABSTRACT

The present invention is equipped with: a substrate (10) that has a surface upon which a drive circuit containing a TFT (20) is formed; a planarizing layer (30) that makes the surface of the substrate (10) planar by covering the drive circuit; and an organic light emitting element (40) that is provided with a first electrode (41) formed upon the surface of the planarization film and connected to the drive circuit, an organic light emitting layer (43) formed upon the first electrode, and a second electrode (44) formed upon the organic light emitting layer. In addition, the planarizing layer (30) includes a first inorganic insulating layer (31) and an organic insulating layer (32) that are layered upon the drive circuit, and the surface of the organic insulating layer (32) is formed with an arithmetic mean roughness Ra of no more than 50 nm.

12 Claims, 8 Drawing Sheets

(51) Int. Cl.
*H01L 27/12* (2006.01)
*H01L 29/66* (2006.01)
*H01L 29/786* (2006.01)
*H10K 59/12* (2023.01)

(52) U.S. Cl.
CPC .... *H01L 27/1274* (2013.01); *H01L 29/66757* (2013.01); *H01L 29/78675* (2013.01); *H10K 59/1201* (2023.02)

(56) References Cited

U.S. PATENT DOCUMENTS

| | | | |
|---|---|---|---|
| 2002/0047567 | A1 | 4/2002 | Fujita et al. |
| 2005/0112906 | A1 | 5/2005 | Maekawa et al. |
| 2009/0195151 | A1 | 8/2009 | Nagayama et al. |
| 2010/0314618 | A1 | 12/2010 | Tanaka et al. |
| 2012/0294102 | A1 | 11/2012 | Ishizu |
| 2013/0168648 | A1* | 7/2013 | Jeong ............... H10K 59/122 438/23 |
| 2014/0326995 | A1 | 11/2014 | Ishizu |
| 2015/0380681 | A1 | 12/2015 | Furukawa et al. |
| 2016/0319159 | A1 | 11/2016 | Minami et al. |
| 2018/0040640 | A1 | 2/2018 | Takahashi et al. |
| 2018/0144950 | A1 | 5/2018 | Jeong et al. |
| 2019/0131325 | A1 | 5/2019 | Liu et al. |
| 2019/0157627 | A1* | 5/2019 | Bae ............... H01L 27/1259 |
| 2019/0181205 | A1 | 6/2019 | Kim |
| 2019/0355760 | A1 | 11/2019 | Takahashi et al. |
| 2020/0168682 | A1 | 5/2020 | Kishimoto |

FOREIGN PATENT DOCUMENTS

| | | |
|---|---|---|
| JP | 2001-312223 A | 11/2001 |
| JP | 2001-356711 A | 12/2001 |
| JP | 2002-083691 A | 3/2002 |
| JP | 2002-122722 A | 4/2002 |
| JP | 2003-308971 A | 10/2003 |
| JP | 2004-046110 A | 2/2004 |
| JP | 2004-046154 A | 2/2004 |
| JP | 2005-077822 A | 3/2005 |
| JP | 2005-159328 A | 6/2005 |
| JP | 2005-336400 A | 12/2005 |
| JP | 2009-181836 A | 8/2009 |
| JP | 2009-227893 A | 10/2009 |
| JP | 2010-139920 A | 6/2010 |
| JP | 2010-287735 A | 12/2010 |
| JP | 2012-178268 A | 9/2012 |
| JP | 2013-008437 A | 1/2013 |
| JP | 2016-029716 A | 3/2016 |
| JP | 2016-153888 A | 8/2016 |
| JP | 2017-011173 A | 1/2017 |
| JP | 2018-025777 A | 2/2018 |
| WO | 2008/035556 A1 | 3/2008 |
| WO | 2014/126037 A1 | 8/2014 |

* cited by examiner

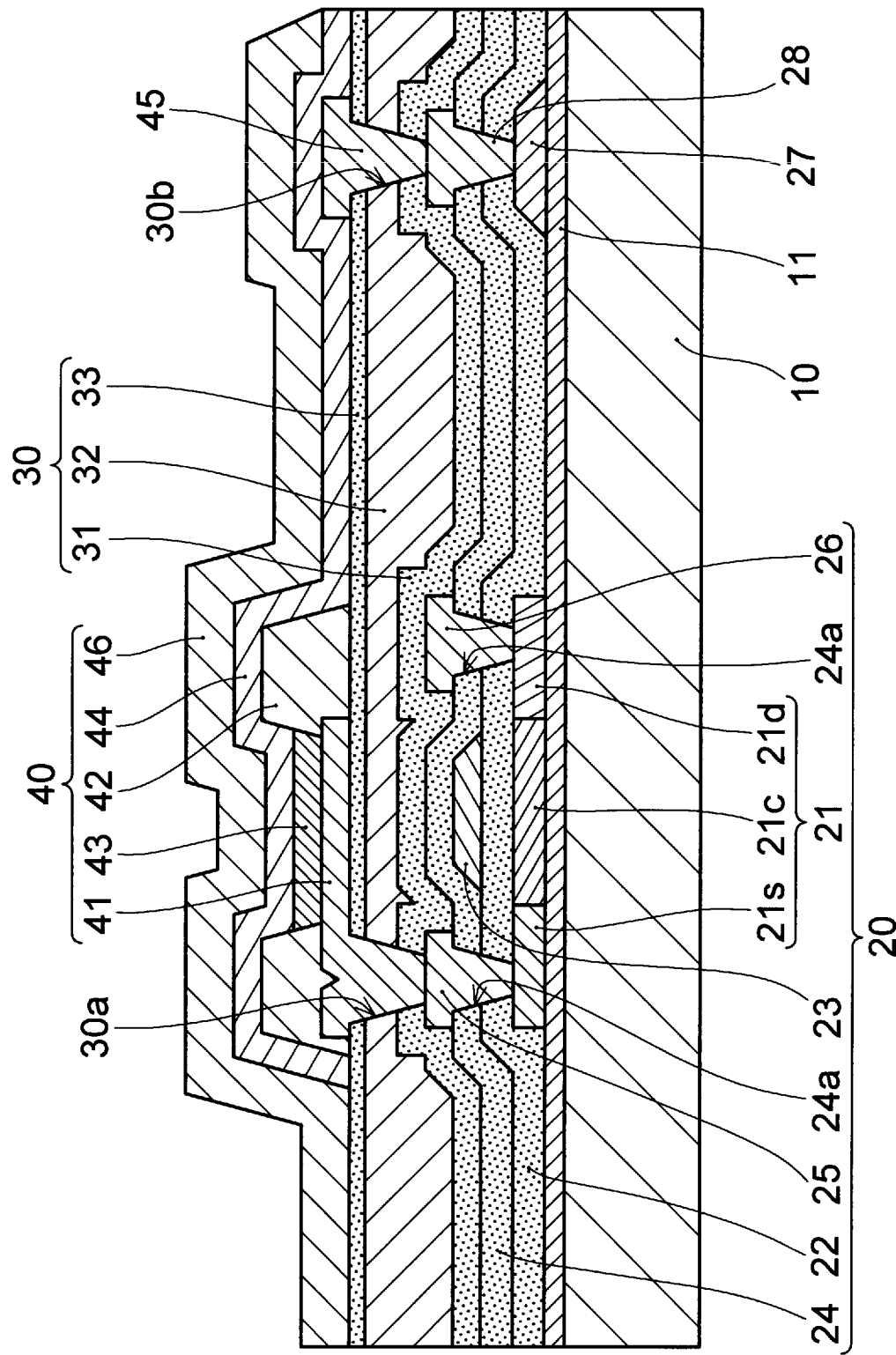

ORGANIC EL DISPLAY APPARATUS WITH SUPPRESSED COLOR AND/OR LUMINANCE NON-UNIFORMITY AND METHOD OF MANUFACTURING ORGANIC EL DISPLAY APPARATUS

TECHNICAL FIELD

The present invention relates to an organic EL display apparatus and a method of manufacturing an organic EL display apparatus.

BACKGROUND ART

In recent years, there is a tendency to adopt an organic EL display apparatus for a large sized television and a mobile apparatus. The organic EL display apparatus is configured by a drive circuit being formed on an insulating substrate, the drive circuit using a thin film transistor (below also called a TFT) as an active element such as a switching element or a drive element in each pixel region, and an organic light emitting element for each pixel being formed on the drive circuit so as to connect to the TFT. The organic EL display apparatus can be categorized into a top emission type in which a front surface of the light emitting element is a display surface and a bottom emission type in which a rear surface of the insulating substrate is a display surface. In the top emission type, the previously-described drive circuit can be formed below the display region of the organic light emitting element, not out of the display region of the organic light emitting element. On the other hand, in the bottom emission type, the drive circuit is formed at the peripheral edge of the display region. Therefore, for a small sized organic EL display apparatus such as a mobile apparatus having a small space to form the drive circuit, the top emission type, or in other words, a configuration such that the drive circuit such as the TFT is formed below almost the entire surface of the display region is often used. On the other hand, the bottom emission type is suitable for the large sized television having some space to spare between pixels.

When the drive circuit including TFT is formed, the surface thereof becomes uneven. As the organic light emitting element is formed thereon, a planarizing layer is formed by covering over the drive circuit with a resin material. In this way, the surface is planarized. In the prior art, this planarizing layer is obtained by, forming a first inorganic insulating layer to be a barrier layer after the TFT is formed, and forming a contact hole for connecting the previously described organic light emitting element and the TFT by a photolithography process, and forming a photosensitive organic insulating layer on the first inorganic insulating layer being formed with the contact hole, and forming a contact hole by photolithography process and wet development. In this way, the organic insulating layer is formed to planarize unevenness of the surface due to forming of the TFT.

Patent document 1 discloses a TFT and a manufacturing method thereof to achieve both a small occupation area and excellent transistor characteristics, the TFT and the manufacturing method being suitable for a switching element for each pixel of an active matrix type display apparatus. Therein, multi-layer TFTs are integrally formed vertically by forming TFTs having the same configuration via an interlayer insulating layer whose surface unevenness is made to be no more than 20 nm by a CMP process. In other words, in forming multi-layer fine TFTs, the planarity of the surface of the interlayer insulating layer between the multi-layer TFTs requires to be made in no more than 20 nm to deal with a small depth of focus. Therefore, this planarizing is different from an intent to planarize an organic insulating layer which is an under layer for an organic light emitting device over the TFT.

PRIOR ART DOCUMENT

Patent Document

Patent Document 1: JP 2017-011173 A

SUMMARY OF THE INVENTION

Problem to be Solved by the Invention

On the other hand, in a case of visually recognizing an organic EL display apparatus, depending on a pixel, color non-uniformity or luminance non-uniformity can occur, causing the visual recognition characteristics to be reduced. As a result of intensive studies on the cause that color non-uniformity or luminance non-uniformity occurs, the present inventor has found that it is caused by a lack of planarity of the surface of the organic light emitting layer. In other words, as described previously, the organic light emitting element is formed on a planarizing layer which is formed on a TFT constituting a drive circuit or the like, and planarizes the surface of the TFT. The surface of an organic insulating layer constituting the planarizing layer is generally planar, so that conventionally it was believed to have no problems. However, as a result of the present inventor having made intensive studies, it was found that the surface of the organic insulating layer was found to be approximately 100 nm to 300 nm in arithmetic average roughness Ra even when using a non-photosensitive resin. With a photosensitive resin being generally used conventionally, it was found that further unevenness occurred, and that forming an electrode of the organic light emitting element and the organic light emitting layer on the surface causes the same degree of surface roughness also for the surface of the organic light emitting layer. When unevenness occurs on the surface of the organic light emitting layer, the orientation of light travelling, when viewed microscopically, becomes in a various direction. Therefore, it was found that, when the display screen is viewed from the front surface, light travelling in a slanted direction is difficult to be visually recognized, causing color non-uniformity and/or luminance non-uniformity.

There is a problem that display definition decreases when display non-uniformity caused by luminance non-uniformity and/or color non-uniformity as described previously occurs, even in a case that there is no obvious display defect such as a non-lighted region, an always-lighted region, or a bright line in a display screen of a display apparatus.

Moreover, in a conventional organic light emitting element, it is practiced to increase a light emitting output by making a microcavity by providing a layer with a large reflectance on a surface of the organic light emitting layer. In this case, there occurs unevenness on the surface of the organic light emitting layer, and thereby, unevenness is formed even on the reflective layer, so that a light from the organic light emitting layer reflects irregularly, and it is not possible to effect a complete resonator. Therefore, there is a problem that, it is not possible to obtain an increase in output.

On the other hand, in the present invention, as it is not an object to manufacture a multi-layer fine TFT, it is not required to form a strict surface planarity at no more than 20 nm as disclosed in the previously described Patent Document 1. It suffices to have such a planarity degree that light emitted from the organic light emitting layer enters substantially to the front surface of the display with a peak in about the center.

An object of the present invention being made in view of such circumstances as described above is to provide an organic EL display apparatus and a manufacturing method thereof in which color non-uniformity and/or luminance non-uniformity of an organic EL display apparatus is suppressed to improve display definition.

Means to Solve the Problem

An organic EL display apparatus according to one embodiment of the present invention comprises: a substrate having a surface on which a drive circuit comprising a thin film transistor is formed, a planarizing layer to planarize the surface of the substrate by covering the drive circuit, and an organic light emitting element, the organic light emitting element comprising a first electrode being formed on a surface of the planarizing layer and connected to the drive circuit, an organic light emitting layer being formed on the first electrode, and a second electrode being formed on the organic light emitting layer, wherein the planarizing layer comprises a first inorganic insulating layer and an organic insulating layer, the first inorganic insulating layer and the organic insulating layer being deposited on the drive circuit, and wherein a surface of the organic insulating layer is formed to less than or equal to 50 nm in arithmetic average roughness Ra.

A method of manufacturing an organic EL display apparatus according to another embodiment of the present invention comprises: forming a drive circuit on a substrate, the drive circuit comprising a thin film transistor (TFT); forming, on a surface of the drive circuit, a first inorganic insulating layer and an organic insulating layer; polishing a surface of the organic insulating layer by chemical mechanical polishing (CMP); forming a contact hole in the organic insulating layer and the first inorganic insulating layer, the contact hole to reach the TFT; embedding a metal at an interior of the contact hole and forming a first electrode at a given region; forming an organic light emitting layer on the first electrode; and forming a second electrode on the organic light emitting layer.

Effects of the Invention

According to the embodiment of the present invention, the organic insulating layer is formed on an uneven surface of the drive circuit comprising a TFT and the surface of the organic insulating layer is polished using CMP to cause the surface to be planarized such that the planarity of the surface is brought to less than or equal to 50 nm in arithmetic average roughness Ra. As a result, light travelling in a slanted direction, when viewed microscopically, is substantially suppressed, causing an occurrence of color non-uniformity and/or luminance non-uniformity to be suppressed and the display quality of the organic EL display apparatus to be substantially increased.

BRIEF DESCRIPTION OF THE DRAWINGS

FIG. 1 shows a cross-sectional view of an organic EL display apparatus according to one embodiment of the present invention.

EMBODIMENT FOR CARRYING OUT THE INVENTION

Figure 2A:
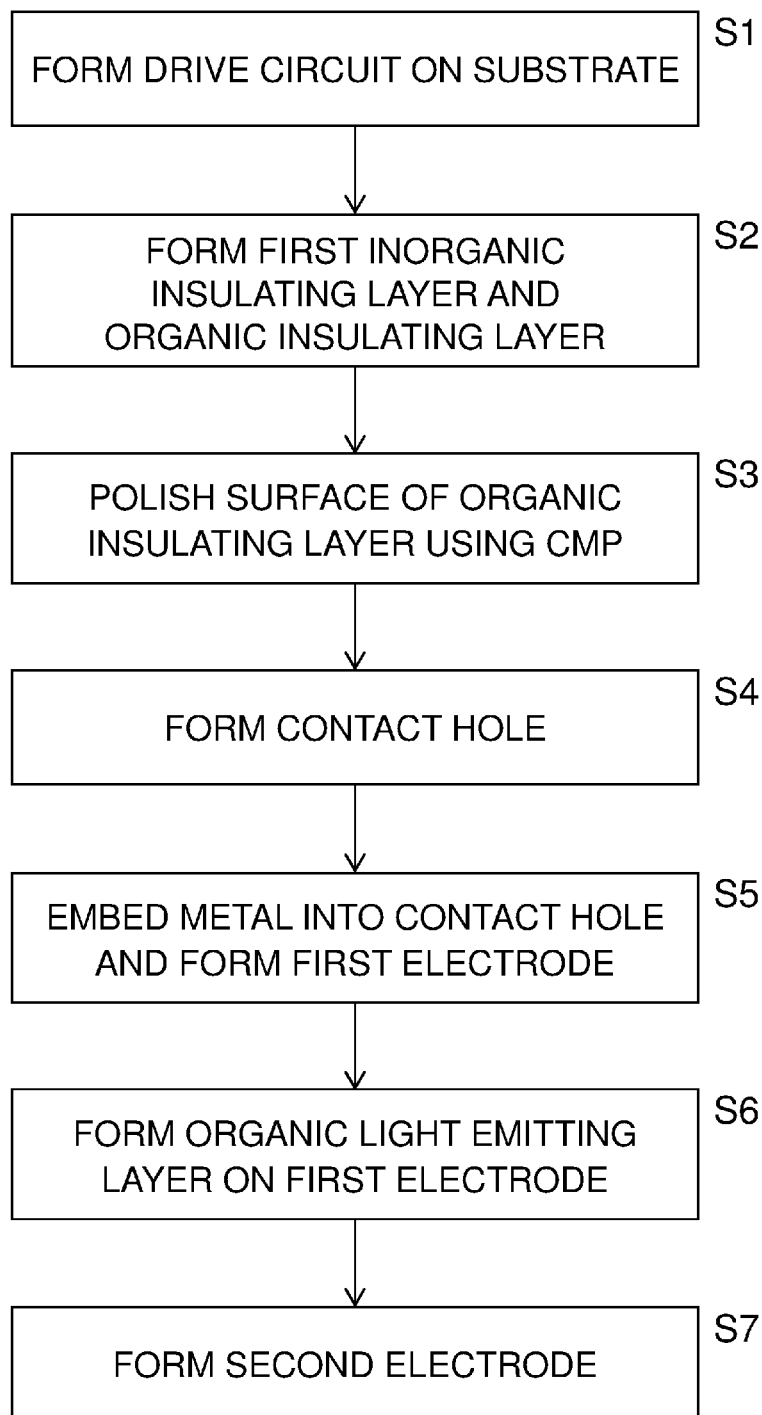
FIG. 2A shows a flowchart of a process of manufacturing an organic EL display apparatus according to Example 1, the Example 1 being without a second inorganic insulating layer in FIG. 1.

An organic EL display apparatus being one embodiment of the present invention will be described below with reference to the drawings. FIG. 1 schematically shows a cross-sectional view of what corresponds to one pixel (while it, more strictly, refers to sub-pixels of red, green, and blue in one pixel), the present specification can also include these sub-pixels to refer thereto.

An organic EL display apparatus according to one embodiment of the present invention, as shown in an explanatory view of a cross section thereof, comprises: a substrate 10 having a surface on which a drive circuit comprising a TFT 20 is formed, a planarizing layer 30 to planarize the surface of the substrate 10 by covering the drive circuit, and an organic light emitting element 40, the organic light emitting element 40 comprising a first electrode 41 being formed on a surface of the planarizing layer 30 and connected to the drive circuit, an organic light emitting layer 43 being formed on the first electrode 41, and a second electrode 44 being formed on the organic light emitting layer 43. Then, the planarizing layer 30 comprises a first inorganic insulating layer 31 and an organic insulating layer 32, the first inorganic insulating layer 31 and the organic insulating layer 32 being deposited on the drive circuit, and the surface of the organic insulating layer 32 is formed to less than or equal to 50 nm in an arithmetic average roughness Ra. Then, the organic light emitting layer 43 is formed such that it avoids a portion being immediately above a contact hole 30*a*.

In other words, the organic EL display apparatus according to the present embodiment has one feature that the surface of the substrate 10 being uneven by the drive circuit being formed thereon is formed to the planarity being less than or equal to 50 nm in the arithmetic average roughness Ra by forming the planarizing layer 30 through a deposition of the inorganic insulating layer 31 and the organic insulating layer 32 and further by polishing the surface of the organic insulating layer 32 using CMP method. The planarizing layer 30 can be formed by further forming a second inorganic insulating layer 33 on the surface of the organic insulating layer 32, and, in the example shown in FIG. 1, the second inorganic insulating layer 33 is also formed. Moreover, the organic EL display apparatus according to the present embodiment has another feature that the organic light emitting layer 43 is formed in a region being not immediately above the contact hole 30*a* to connect the drive circuit and the first electrode 41.

As described previously, as a result of the present inventors having carried out intensive studies on the cause that color non-uniformity or luminance non-uniformity of the organic EL display apparatus occurs, it was found that there is unevenness on the surface of the organic light emitting layer 43 of the organic light emitting element 40, the surface of the organic light emitting layer 43 is not completely planar but has an inclined portion when viewed microscopically, and, when inclined, the normal direction of the surface of the organic light emitting layer 43 is inclined relative to the normal direction of the display surface. Then, in a case of visually recognizing from a direction perpendicular to the display surface, it becomes difficult to recognize light of a pixel for which light emitted travels in a slanted direction, causing deterioration in luminance or a color of mixed colors to change. In other words, light emitted having maximum luminance in the normal direction thereof will have luminance thereof decreasing as it is inclined relative to the normal direction. With a small-sized display apparatus such as a smartphone, the size of this sub-pixel is very small with one side of a few tens of μm. Therefore, even with slight unevenness, light emitted toward the front becomes very weak for a sub-pixel having unevenness on the surface of the organic light emitting layer 43.

Conventionally, as the countermeasure for such color non-uniformity and/or luminance non-uniformity, incorporating a TFT at the external edge of the display panel and, using a circuit, adjusting luminance of a pixel having color non-uniformity and/or luminance non-uniformity in an inspection after forming into a product are carrier out. Therefore, there is also a problem of a drive circuit becoming complex.

According to one embodiment, as the present inventor has found the cause of color non-uniformity and/or luminance non-uniformity as described previously, and found that the color non-uniformity and/or luminance non-uniformity almost does not occur by bringing the planarity of the surface of the planarizing layer 30 to be a base of the light emitting element to less than or equal to 50 nm and forming the organic light emitting layer 43 while avoiding a portion being immediately above the contact hole 30*a* in order to improve the planarity of the surface of the above-mentioned organic light emitting layer 43. The present inventor has found that, while the smaller the surface roughness the more preferable, bringing the planarity to less than or equal to 20 nm as shown in previously-described Patent Document 1 is not required, so that the color non-uniformity or luminance non-uniformity almost does not occur even when the arithmetic average roughness Ra is greater than or equal to 20 nm. In other words, while the smaller the surface roughness the more preferable, so that no lower limit is set, but the polishing work gets cumbersome to decrease the surface roughness, so that bringing the surface roughness to 20 nm or more and less than or equal to 50 nm is preferable.

More specifically, with the conventional method, with respect to the above-mentioned planarizing layer, an inorganic barrier layer is formed, then a contact hole is formed by dry etching, and an organic insulating layer (a photosensitive resin) is formed thereon to form a contact hole by wet etching. In other words, as described previously, there was believed to be no problem as the surface is planarized since the organic insulating layer is formed by applying a liquid resin, the surface is planarized. However, the planarity of the surface of the above-mentioned organic insulating layer is approximately 100 nm to 300 nm in the arithmetic average roughness Ra even when a non-photosensitive resin is used, the above-mentioned planarity is greater than the above with a photosensitive resin, and the present inventor has found that planarizing to such a degree is not sufficient. In this case, when the photosensitive resin is used, the surface roughness further increases due to the influence of a photopolymerization initiator to be mixed thereinto. Then, as described previously, it has been found that an occurrence of color non-uniformity and/or luminance non-uniformity can be entirely suppressed by bringing the surface roughness to greater than or equal to 20 nm and less than or equal to 50 nm in the arithmetic average roughness Ra through polishing the surface of the organic insulating layer 32 using CMP. In other words, while it is not required to bring the planarity to less than or equal to 20 nm as disclosed in the previously-described Patent Document 1, it is required to bring the planarity to less than or equal to approximately 50 nm.

(Structure of Organic EL Display Apparatus)

The organic EL display apparatus shown in FIG. 1 and the method of manufacturing thereof are specifically described below.

The substrate 10 needs to transmit light emitted in the organic light emitting layer 43 in a case of a bottom emission type in which a display image is visually recognized with the substrate surface as a display surface, so that an insulating substrate with a light-transmitting material is used. More specifically, a glass substrate, or a resin film such as polyimide is used. Using the resin film makes it possible to make the organic EL display apparatus flexible and to bond it to a curved surface.

In a case that the substrate 10 is a resin film such as polyimide, the surface thereof is not crystalline and it is difficult to directly form a semiconductor layer on the surface, so that a base coat layer 11 is formed, although this is not required in a case that the substrate 10 is a glass substrate. As the base coat layer 11, a deposited body of $SiO_2$ having a thickness of approximately 500 nm, $SiN_x$ having a thickness of approximately 50 nm, and $SiO_2$ having a thickness of approximately 250 nm, for example, is formed.

A drive circuit comprising the TFT 20 is formed on the base coat layer 11. While only a cathode wiring 27 is shown in FIG. 1, other gate wirings and signal wirings are also similarly formed. Then, the TFT 20 is formed thereon. While only the TFT 20 to drive the light emitting element 40 is shown in FIG. 1, other TFTs such as other switching TFTs are also similarly formed. In a case that the organic EL display apparatus is the top emission type having a surface opposite to the substrate 10 as a display surface, the drive circuit can be formed over the entire surface below the light emitting region of the organic light emitting element 40. However, in a case of the bottom emission type having the substrate 10 end as the display surface, the TFT cannot be formed below the light emitting region of the organic light emitting element 40. Therefore, it is necessary that the TFT be formed at the peripheral edge of a portion planarly overlapping the light emitting region. In this case, as an inclined surface is formed at a bordering portion between the peripheral edge at which the surrounding TFT or wiring is formed and a region under the light emitting region in which the TFT is not formed, unevenness occurs at the peripheral edge of the light emitting region, causing the display quality to deteriorate. Therefore, even with the bottom emission type, the same degree of planarity is needed. While a capacitor can also be formed for each pixel, it has a large area and the thickness thereof is small, so that it almost does not cause a fine unevenness even when it is formed below the light emitting region.

The TFT 20 comprises a semiconductor layer 21 comprising a source 21s, a channel 21c, and a drain 21d; a gate insulating layer 22; a gate electrode 23; an interlayer insulating layer 24; a source electrode 25; and a drain electrode 26. Specifically, a drive circuit comprising the TFT 20 is formed as follows. The gate insulating layer 22 comprises $SiO_2$ having approximately 50 nm in thickness, while the gate electrode 23 is formed by patterning after forming a layer such as Mo having approximately 250 nm in thickness. Thereon the interlayer insulating layer 24 comprising an $SiO_2$ layer of approximately 300 nm in thickness and an $SiN_x$ layer of approximately 300 nm in thickness being formed on the gate electrode 23, and the source electrode 25 and the drain electrode 26 being formed so as to be connected to the source 21s and the drain 21d. Before the interlayer insulating layer 24 is formed, the cathode wiring 27 and the electrode connecting portion of the source 21s and the drain 21d are doped with boron and leading to increased concentration ($p^+$), and activated by annealing. More particular structures will be described in particular examples of the below described manufacturing method. While the example shown in FIG. 1 shows a top gate structure in which the gate electrode 23 is formed at a portion opposing the substrate 10 of the semiconductor layer 21, the same also applies to a bottom gate structure in which the gate electrode 23 is formed on the substrate 10.

On the surface of the drive circuit comprising the TFT 20, a first inorganic insulating layer 31 comprising $SiN_x$ of approximately 200 nm in thickness as a barrier layer and an organic insulating layer 32 comprising a polyimide or acrylic resin, for example, of approximately 2 μm in thickness and the surface roughness is brought to less than or equal to 50 nm in the arithmetic average roughness Ra using CMP. The above-mentioned organic insulating layer can also be a photosensitive organic insulating layer into which is mixed a photopolymerization initiator. With respect to the photosensitive organic insulating layer, the organic insulating layer 32 is formed after forming the first inorganic insulating layer 31 and the contact hole 30a is formed by exposure and development using the photolithography process. In this case, the CMP can be carried out after the contact hole 30a is formed. Even though the polishing agent for CMP gets into the contact hole 30a at the time of CMP polishing the organic insulating layer 32, as the size of the contact hole is much greater than (for example, approximately 50 times) the particle diameter of the polishing agent, the polishing agent can be removed by cleaning, so that no problems occur in particular. In a case that the organic insulating layer 32 is non-photosensitive, the contact hole 30a for the organic insulating layer 32 is formed collectively with that for the first inorganic insulating layer 31. On this occasion, a contact hole 30b to form a second contact 45 to connect a cathode (a second electrode) of the organic EL display apparatus to the cathode wiring 27 is also formed in the planarizing layer 30 at the same time.

In the example shown in FIG. 1, the second inorganic insulating layer 33 of approximately 400 nm in thickness, the second inorganic insulating layer 33 comprising $SiN_x$, for example, is formed on the organic insulating layer 32. The second inorganic insulating layer 33 being formed is preferable in that corrosion of the organic insulating layer by the etchant can be prevented at the time of etching to form the contact hole 30a. Moreover, the inorganic insulating layer maintains the planarity of the base thereof as it is, so that there is no need to polish the inorganic insulating layer. The contact holes 30a for the three layers are formed by collectively etching the three layers after forming the second inorganic insulating layer 33.

Then, a conductor layer comprising ITO, a metal such as Ag or APC, and ITO, for example, is deposited by sputtering or the like to cause a metal such as Ag or the like to be embedded into the contact hole 30a, and the first electrode (anode) 41 is formed by a deposited layer of ITO/Ag or APC/ITO in which the surface and the lowermost layer are ITO layers and Ag or APC is interposed between the ITO layers, using patterning after a conductor layer of the same metal such as Ag or APC and ITO is formed on the surface of the organic insulating layer 32 or the second inorganic insulating layer 33 (in a case that the second inorganic insulating layer 33 is formed), or in other words, the planarizing layer 30. While the first electrode 41 is formed continuously to the conductor layer being embedded into the contact hole 30a, it is formed by patterning it such that it is positioned on the surface of the planarizing layer 30 whose surface is planarized, avoiding where a recess on the contact hole 30a is likely to occur. In this way, the planarity of the surface of the first electrode 41 is brought to the same degree of planarity as that of the surface of the planarizing layer 30, and the surface of the organic light emitting layer 43 on the first electrode 41 is also brought to the same degree of planarity.

The first electrode (anode) 41 preferably has a work function of approximately 5 eV, so that, in a case of the top emission type, the above-described material is used. The ITO layer is formed to the thickness of approximately 10 nm, and the Ag or APC is formed to the thickness of approximately 100 nm. In a case of the bottom emission type, the ITO layer is formed to the thickness of approximately greater than or equal to 300 nm and less than or equal to 1 μm, for example. An insulating bank 42, being formed of an insulating material, to insulate the anode from the cathode as well as to demarcate each pixel is formed at the peripheral edge of the above-mentioned first electrode 41, and the organic light emitting layer 43 is deposited on the first electrode 41 being surrounded by the insulating bank 42.

The organic light emitting layer 43 is deposited on the first electrode 41 being exposed while being surrounded by the insulating bank 42. While the organic light emitting layer 43 is shown as one layer in FIG. 1, it is formed as a plurality of layers with various materials being deposited. Moreover, as the organic light emitting layer 43 is susceptible to moisture and cannot be patterned after forming it on the entire surface, it is formed by selectively vapor depositing onto only a required portion, using a mask, an organic material being evaporated or sublimed. Alternatively, the organic light emitting layer 43 can be formed by printing.

More specifically, as a layer to be in contact with the first electrode (anode electrode) 41, for example, a positive hole injection layer can be provided, which comprises a material having a high compatibility with ionization energy to improve the injectability of positive holes. A positive hole transport layer allowing trapping of electrons into the light emitting layer (as the energy barrier) as well as improving the stable transport of positive holes is formed by an amine-based material, for example, on the positive hole injection layer. Moreover, a light emitting layer to be selected in accordance with the light emitting wavelength is formed thereon using $Alq_3$ being doped with a red or green organic fluorescent material for red or green light emission, for example. Moreover, a DSA-based organic material is used as a blue color-based material. On the other hand, for coloring using a color filter (not shown), all of the light emitting layers can be formed with the same material without any doping. On the light emitting layer is further formed, using $Alq_3$, an electron transport layer capable of stably transporting electrons as well as improving the electron injectability. These layers, each having several tens of nm in thickness, are deposited to form deposited layers being the organic light emitting layer 43. An electron injection layer capable of improving the electron injectability, such as LiF or Liq, can also be provided between this organic light emitting layer 43 and the second electrode 44. While this is not an organic layer, it is comprised within the organic light emitting layer 43 in the present specification since it is to emit light by an organic layer.

As described previously, with respect to the light emitting layer of the deposited organic light emitting layer 43, an organic material as a material according to each color of R, G, or B is not deposited, so that a color display apparatus can be provided using a color filter. In other words, the light emitting layer can be formed using the same organic material and a luminescent color can be specified using the color filter not shown. Moreover, emphasizing the light emission performance, the positive hole transport layer and the electron transport layer are preferably deposited separately using a material suitable for the light emitting layer. However, taking into account the material cost aspect, depositing can also be carried out using the same material being common to two or three colors of R, G, and B.

After the whole deposited organic light emitting layer 43 comprising the electron injection layer made of, for example, LiF is formed, the second electrode (for example, cathode) 44 is formed on the surface thereof. More specifically, the second electrode 44 is formed over the organic light emitting layer 43. The second electrode (cathode) 44 is continuously formed to be common across all the pixels. The cathode 44 is connected to the cathode wiring 27 via a first contact 28 formed in the insulating layer 22 and the insulating layer 24 of the TFT 20 and the second contact 45 formed in the planarizing layer 30. The second electrode 44 being formed by a light-transmitting material, for example, a thin film Mg—Ag eutectic layer, is susceptible to corrosion with moisture, so that it is encapsulated with an encapsulation layer 46 being provided on the surface thereof. The cathode material is preferably a material whose work function is small, so that an alkaline metal or an alkaline earth metal can be used. While Mg, whose work function is small at 3.6 eV, is preferable, it is active and not stable, so that it is co-deposited with approximately 10 mass % of Ag, whose work function is 4.25 eV. Al, whose work function is also small at approximately 4.25 eV, can also be used as a cathode material with LiF being used as the under layer. Therefore, with the bottom emission type, Al can be formed thickly in this second electrode 44.

The encapsulation layer (TFE: Thin Film Encapsulation) 46, comprising an inorganic insulating layer such as $SiN_x$ or $SiO_2$, for example, can be formed with one deposited layer or with at least two deposited layers. For example, it is formed with a deposited layer having the thickness of one layer of approximately from 0.1 μm to 0.5 μm, for example, and, preferably, with deposited layers of approximately two layers. This encapsulation layer 46 is preferably formed in a plurality of layers, each with different materials. Even when pin holes are created by the encapsulation layer 46 being formed with a plurality of layers, the pin holes seldom match completely in the plurality of layers, so that the encapsulation layer 46 is completely shielded from outer air. As described previously, this encapsulation layer 46 is formed so as to completely encapsulate the organic light emitting layer 43 and the second electrode 44. The encapsulation layer 46 can also comprise an organic insulating material in between two inorganic insulating layers.

Method of Manufacturing an Organic EL Display Apparatus

Example 1

A method of manufacturing an organic EL display apparatus without a second inorganic insulating layer 33 of an organic EL display apparatus shown in FIG. 1 is explained with reference to flowcharts in FIGS. 2A and 2B and views of the process of manufacturing in FIGS. 3A to 3G.

Figure 2B:
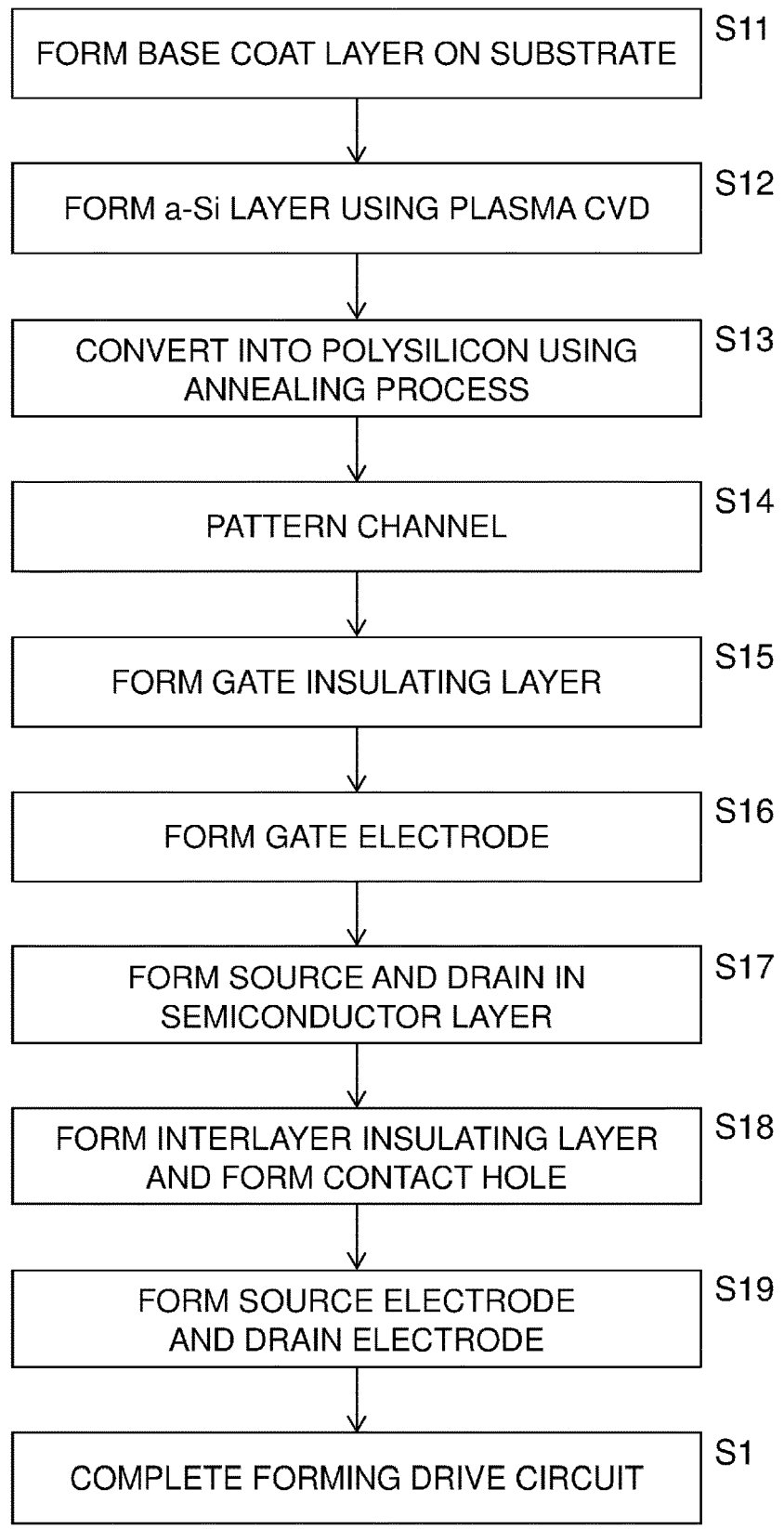
FIG. 2B shows a flowchart explaining the process of FIG. 2A in further detail.
Figure 3A:
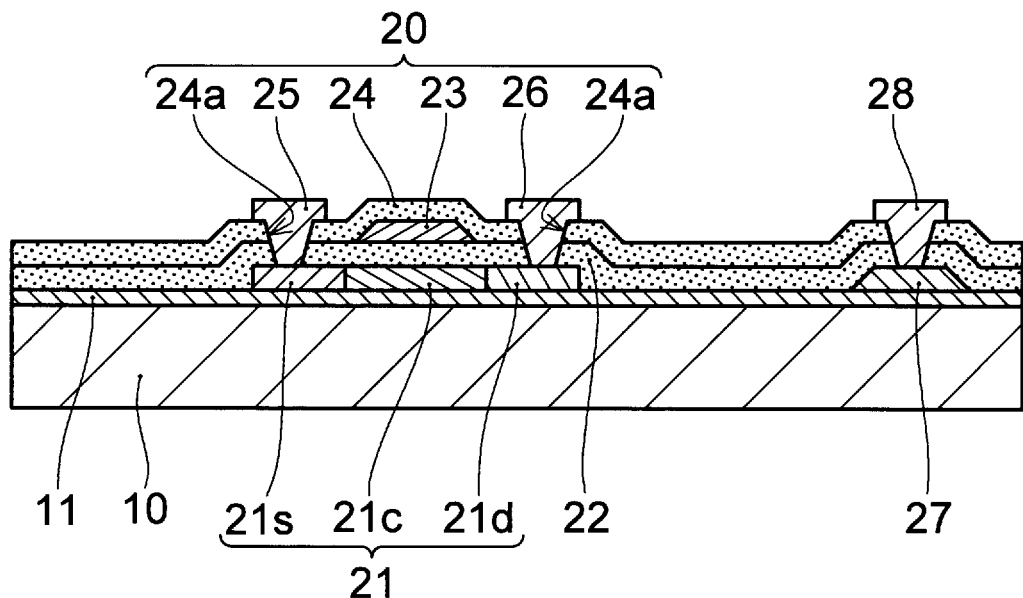
FIG. 3A shows a cross-sectional view of the process of manufacturing the organic EL display apparatus according to Example 1, the Example 1 being without the second inorganic insulating layer in FIG. 1.

First, as shown in FIG. 3A, a drive circuit comprising a TFT 20 is formed on a substrate 10 (S1 in FIG. 2A). Specifically, a base coat layer 11 is formed on the substrate 10 as shown in the flowchart in FIG. 2B (S11). The base coat layer 11 is formed, using plasma CVD, for example, by depositing an underlayer comprising an $SiO_2$ layer having a thickness of approximately 500 nm, and an $SiN_x$ layer having a thickness of approximately 50 nm on the $SiO_2$ layer, and by further depositing, as an overlayer, an $SiO_2$ layer having a thickness of approximately 250 nm.

Thereafter, a semiconductor layer 21 comprising an amorphous silicon (a-Si) layer is formed on the base coat layer 11 using reduced pressure plasma CVD, for example (S12). Thereafter, conversion into polysilicon (LTPS: low temperature polysilicon) is carried out by carrying out an annealing process for approximately 45 minutes under the temperature of approximately 450 degrees Celsius under a nitrogen atmosphere, for example (S13).

Next, a resist mask is formed using a photolithography process, the semiconductor layer 21 is patterned by dry etching, and a portion of the semiconductor layer 21 to be the TFT 20 and a wiring such as a cathode wiring 27 are formed (S14). Thereafter, a gate insulating layer 22 is formed (S15). The gate insulating layer 22 is formed by forming $SiO_2$ to a thickness of approximately 50 nm using plasma CVD.

Thereafter, a gate electrode 23 is formed by forming a metal layer of molybdenum (Mo) having a thickness of approximately 250 nm using sputtering, for example, and patterning the Mo layer by carrying out dry etching after forming a resist mask using a photolithography process (S16).

Thereafter, a source 21s and a drain 21d are formed in the semiconductor layer 21. More specifically, after boron ions ($B^+$) are doped, for example, the doped boron ions are activated by carrying out an annealing process for approximately one hour at the temperature of approximately 400 degrees Celsius, allowing the source 21s and the drain 21d to be formed with the resistance thereof being reduced (S17). As the gate electrode 23 serves as a mask, the boron ions are not implanted into a channel 21c, but are implanted only into the source 21s and the drain 21d, allowing the resistance of the source 21s and the drain 21d to be reduced.

Thereafter, an interlayer insulating layer 24 is formed on the entire surface and contact holes 24a to expose a part of the source 21s and the drain 21d are formed (S18). The interlayer insulating layer 24 is formed by forming a deposited layer of an underlayer comprising mainly $SiO_2$ and having a thickness of approximately 300 nm, and an overlayer comprising mainly $SiN_x$ and having a thickness of approximately 300 nm, using reduced pressure plasma CVD, for example. The contact hole 24a is formed by forming a mask through formation of a resist layer and a photolithography process, and carrying out wet etching.

Thereafter, a metal material is deposited, so that a metal is embedded into the contact hole 24a and a metal layer of a source electrode 25 and a drain electrode 26 is formed on the surface of the interlayer insulating layer 24 (S19). The source electrode 25 and the drain electrode 26 are formed by, using sputtering, for example, depositing a Ti layer having a thickness of approximately 300 nm and an Al layer having a thickness of approximately 300 nm and further depositing thereon Ti having a thickness of approximately 100 nm. Patterning a metal layer being formed on the interlayer insulating layer 24 using the photolithography process and wet etching as described previously allows the source electrode 25 and the drain electrode 26 being connected to the source 21s and the drain 21d, respectively, of the semiconductor layer 21 to be formed. A first contact 28 connected to the cathode wiring 27 is formed using entirely the same method with the same processes as forming this source electrode 25 and drain electrode 26.

Using the above-described processes, a drive circuit comprising a TFT 20 of the top gate type using a top contact type LTPS, or, in other words, a portion called a backplane is formed. However, the TFT 20 is not limited to this structure, so that it can be used with the top gate type using the bottom contact type structure, the bottom gate type using the top contact type structure, or the bottom gate type using the bottom contact type structure.

Figure 3B:
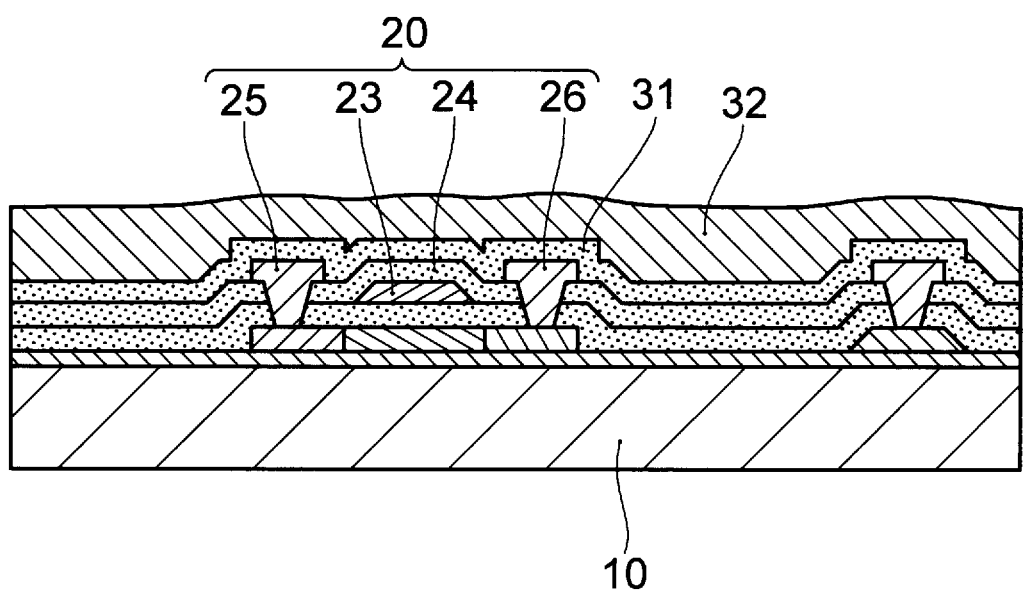
FIG. 3B shows a cross-sectional view of the process of manufacturing the organic EL display apparatus according to Example 1, the Example 1 being without the second inorganic insulating layer in FIG. 1.

Thereafter, as shown in FIG. 3B, a first inorganic insulating layer 31 and an organic insulating layer 32 are formed on the surface of the drive circuit (S2 back in FIG. 2A). The first inorganic insulating layer 31 is formed by forming a layer of $SiN_x$ having a thickness of approximately 200 nm using plasma CVD, for example. The first inorganic insulating layer 31 functions as a barrier layer to prevent a component of the organic insulating layer 32 from penetrating toward the TFT 20. Moreover, the organic insulating layer 32 is intended to fill up a portion of unevenness present on the surface due to the formation of the TFT 20. The surface of the organic insulating layer 32 is easily planarized by applying a liquid-like resin. While methods of applying comprise a slit coat method or a spin coat method, a slit and spin coat method combining both can be used. This organic insulating layer 32 is formed so as to have the thickness of approximately 2 μm, so that a polyimide resin or an acrylic resin can be used, for example. It can be a photosensitive resin in which a photo polymerization initiator is mixed into these resins, an example of the resin mixed with the photo polymerization initiator will be described below. However, a non-photosensitive resin not containing the photo polymerization initiator is preferable since it is high in purity and, even more, the surface smoothness thereof is high. More particularly, an acrylic resin is preferable.

Figure 3C:
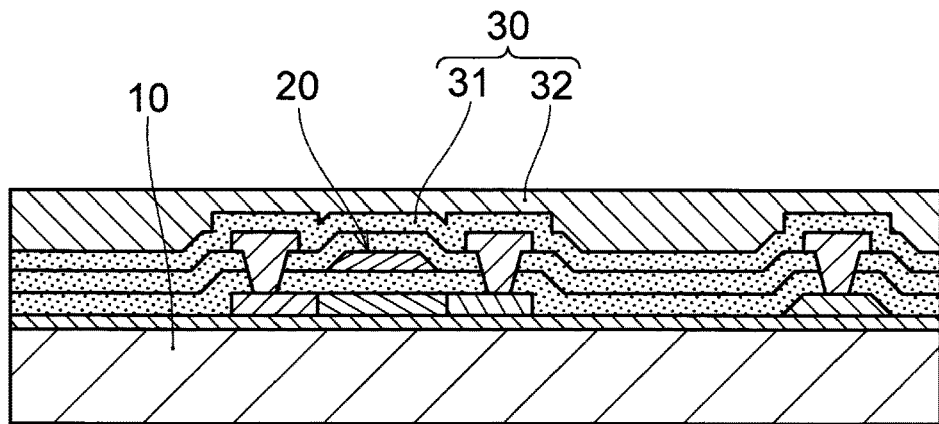
FIG. 3C shows a cross-sectional view of the process of manufacturing the organic EL display apparatus according to Example 1, the Example 1 being without the second inorganic insulating layer in FIG. 1.

Next, as shown in FIG. 3C, the surface of the organic insulating layer 32 is polished by CMP (S3). As the liquid resin is applied and dried to obtain the organic insulating layer 32, the surface of the organic insulating layer 32 is easily planarized and, as described previously, the surface thereof is formed to approximately 100 nm to 300 nm in arithmetic average surface roughness Ra. However, the present inventor has found that, as described previously, the planarity of the planarising layer obtained by only applying the liquid resin and drying causes color non-uniformity and/or luminance non-uniformity occurs, so that the light emitting characteristics cannot be satisfied adequately. Therefore, using CMP, the surface is polished to the arithmetic average roughness Ra of less than or equal to 50 nm. While the smaller the planarity the more preferable, such a high degree of planarity as to be less than or equal to 20 nm as shown in Patent Document 1 is not required. When the planarity is less than or equal to 50 nm, the color non-uniformity and/or luminance non-uniformity does not appear to such a degree as to be problematic. The polishing is carried out by CMP the surface of the organic insulating layer 32 while supplying, for example, a Ceria ($CeO_2$)-based slurry or a fumed silica-based slurry along with water and alcohol.

Figure 3D:
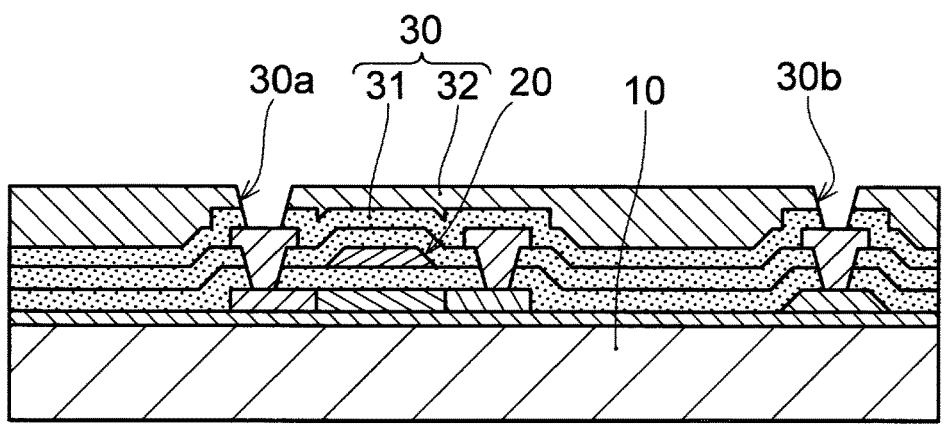
FIG. 3D shows a cross-sectional view of the process of manufacturing the organic EL display apparatus according to Example 1, the Example 1 being without the second inorganic insulating layer in FIG. 1.

Thereafter, as shown in FIG. 3D, a contact hole 30a to reach the TFT 20 is formed in the planarizing layer 30 (S4). In the same manner as the previously-described contact hole 24a, forming of the contact hole 30a is carried out using etching such as dry etching after a resist mask is formed. In a case of collectively etching layers in which an inorganic insulating layer and an organic insulating layer co-exist, such as the planarizing layer 30, the etching rates of both of the layers differ from each other, so that using dry etching in particular is preferable for making it unlikely for a stepped portion to be produced at the interface of both of the layers. When the stepped portion is produced, the interior of the contact hole 30a is not completely embedded with metal, making it likely to produce the problem of the contact resistance of the metal with the source electrode 25 increasing.

Figure 3E:
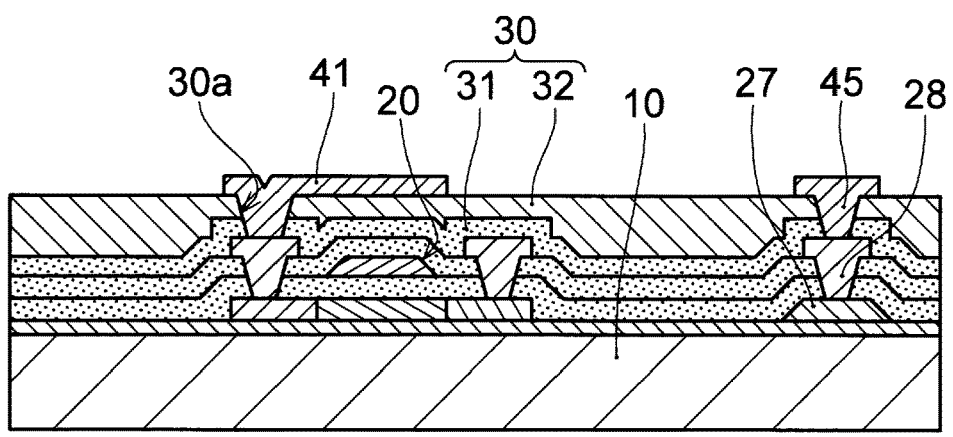
FIG. 3E shows a cross-sectional view of the process of manufacturing the organic EL display apparatus according to Example 1, the Example 1 being without the second inorganic insulating layer in FIG. 1.

Thereafter, as shown in FIG. 3E, a metal is embedded at the interior of the contact hole 30a and a first electrode 41 for the organic light emitting element 40 is formed in a given region (S5). More specifically, using sputtering, for example, an underlayer in which are deposited an ITO layer having a thickness of approximately 10 nm and an Ag layer or an APC layer having a thickness of approximately 100 nm, and an overlayer comprising an ITO layer having a thickness of approximately 10 nm are formed. As a result, a deposited layer of the ITO, the metal layer, and the ITO layer is formed on the surface of the planarizing layer 30 as well as the ITO and metal being embedded at the interior of the contact hole 30a. Thereafter, the deposited layer of the ITO, the metal and the ITO are patterned to form the first electrode 41.

Figure 3F:
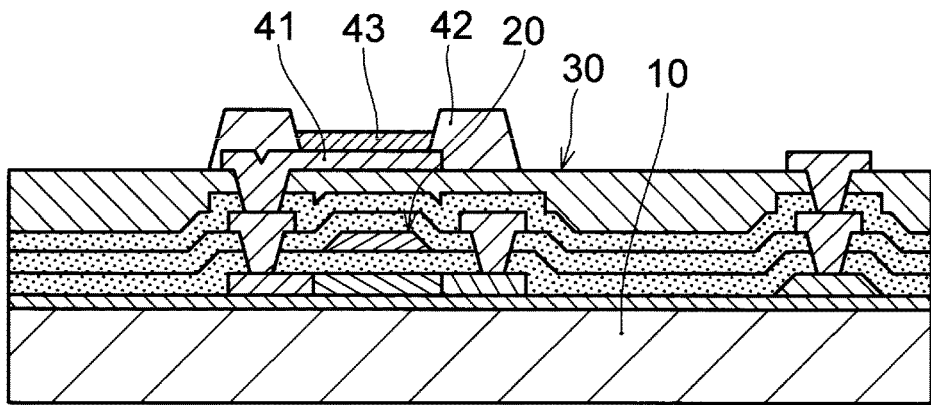
FIG. 3F shows a cross-sectional view of the process of manufacturing the organic EL display apparatus according to Example 1, the Example 1 being without the second inorganic insulating layer in FIG. 1.

Thereafter, as shown in FIG. 3F, an organic light emitting layer 43 is formed on the first electrode 41 (S6). Specifically, an insulating bank 42 to prevent the cathode and the anode from being in contact with each other as well as to demarcate each pixel is formed at the peripheral edge of the first electrode 41. The insulating bank 42 can be an inorganic insulating layer such as $SiO_2$, or an organic insulating layer such as a polyimide resin or an acrylic resin. Such an insulating layer is formed on the entire surface and patterned such that a given location of the first electrode 41 is exposed. The insulating bank 42 is formed to a height of approximately 1 µm. As described previously, while various organic materials are deposited in forming of the organic light emitting layer 43, depositing of the organic materials is carried out by vacuum vapor deposition, for example, in which case the organic light emitting layer 43 is formed through an aperture of a vapor deposition mask, the vapor deposition mask having the aperture corresponding to a desired sub-pixel of R, G, or B. A layer such as LiF to improve the injectability of electrons can be formed on the surface of the organic light emitting layer 43. The organic light emitting layer 43 can also be formed by printing such as inkjet printing, not by vapor deposition. Ag or APC is used in the first electrode 41 for the reason that light emitted in the organic light emitting layer 43 is reflected for use as the top emission type.

Figure 3G:
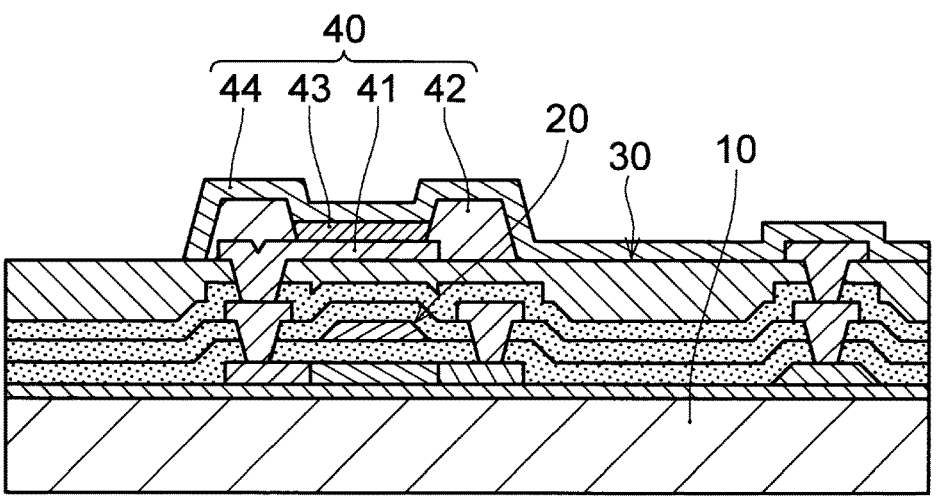
FIG. 3G shows a cross-sectional view of the process of manufacturing the organic EL display apparatus according to Example 1, which is without the second inorganic insulating layer in FIG. 1.

Thereafter, as shown in FIG. 3G, a second electrode (cathode) 44 is formed on the organic light emitting layer 43 (S7). The second electrode 44 is formed by forming, on the entire surface, a thin layer of Mg—Ag eutectic layer using vapor deposition, for example, to make it a cathode. The second electrode 44 is formed also on the second contact 45 and connected to the cathode wiring 27 via the second contact 45 and the first contact 28. With respect to the Mg—Ag eutectic layer, Mg and Ag have different melting points, so that Mg and Ag are evaporated from different crucibles to be eutecticized at the time of formation of the Mg—Ag eutectic layer. With the Mg—Ag eutectic layer comprising Mg at approximately 90 mass % and Ag at approximately 10 mass %, the second electrode 44 is formed to the thickness of approximately 10 nm to 20 nm, for example.

An encapsulation layer 46 to protect the second electrode 44 and the organic light emitting layer 43 from moisture or oxygen is formed on the above-mentioned second electrode 44. The encapsulation layer 46 protects the second electrode 44 and the organic light emitting layer 43 being susceptible to moisture or oxygen, so that an inorganic insulating layer such as $SiO_2$ or $SiN_x$ being difficult to absorb moisture is formed using plasma CVD. Even more, the encapsulation layer 46 is formed such that the end portion thereof comes into close contact with an inorganic layer such as a second inorganic insulating layer 33. This is because, while joining of the inorganic layers together causes them to be joined in close contact with each other, it is difficult to obtain a complete joining, with an organic layer, having a good contactability. Therefore, in a case of no second inorganic insulating layer 33 shown in FIG. 1, it is preferable to remove a portion of the organic insulating layer 32 to cause the organic insulating layer 32 to be joined with the first inorganic insulating layer being the underlayer thereof. This makes it possible to fully prevent penetration of moisture.

Example 2

In the method of manufacturing an organic EL display apparatus according to Example 1 as shown in FIGS. 2A and 2B and FIGS. 3A to 3G, the planarizing layer 30 is formed of the first inorganic insulating layer 31 and the organic insulating layer 32 (a structure without the second inorganic insulating layer 33 of the structure in FIG. 1). Even with such a structure, the surface of the organic insulating layer 32 is polished and the first electrode 41 is formed on the surface thereof. Therefore, the surface of the planarizing layer 30 is planarized, so that there are no problems. However, there is a problem that, when wet etching is carried out at the time of forming the contact hole 30a, moisture easily penetrates the organic insulating layer 32 and, even when dry etching is carried out, an etching gas easily penetrates the organic insulating layer 32. In a case that moisture penetrates the organic insulating layer 32, the material of the organic light emitting layer 43 or the second electrode 44 could deteriorate when moisture leaches out at the time the light emitting element is formed and is in operation. Therefore, the second inorganic insulating layer 33 is preferably formed on the surface of the organic insulating layer 32, the structure of which is shown in FIG. 1. The above-mentioned method of manufacturing is explained with reference to FIGS. 4A to 4E.

Figure 4A:
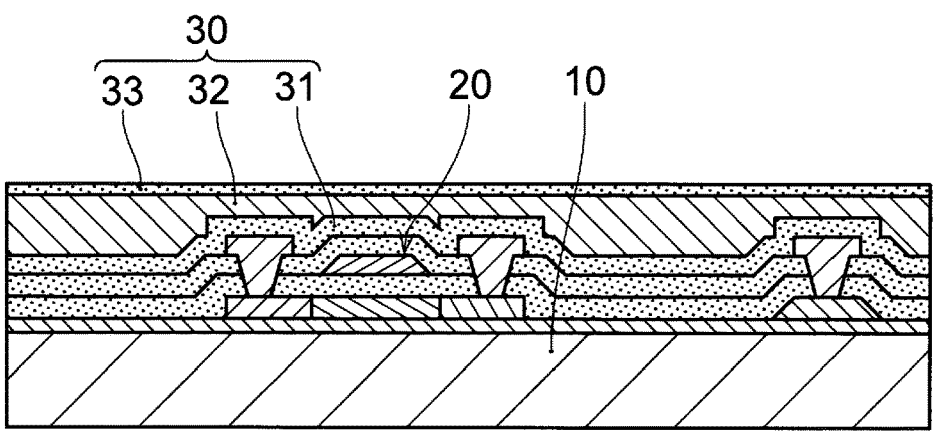
FIG. 4A shows a cross-sectional view of the process of manufacturing the organic EL display apparatus in FIG. 1 according to Example 2.

Up to the process shown in previously-described FIG. 3C, the above-mentioned method is carried out in the same manner as that according to Example 1. In other words, the surface of the organic insulating layer 32 is planarized using CMP. Thereafter, as shown in FIG. 4A, the second inorganic insulating layer 33 is formed by forming $SiN_x$ having a thickness of approximately 200 nm using plasma CVD in the same manner as the first inorganic insulating layer 31. The second inorganic insulating layer 33 is formed by depositing an inorganic material using a method such as plasma CVD as described previously, and, even more, it is very thin, so that the planarity of the polished surface of the organic insulating layer 32 is maintained as it is. Therefore, even for the surface of the second inorganic insulating layer 33, the planarity being less than or equal to 50 nm in arithmetic average roughness Ra is obtained. In other words, while the planarizing layer 30 is configured by the first inorganic insulating layer 31, the organic insulating layer 32, and the second inorganic insulating layer 33 in the Example 2, the surface of the planarizing layer 30 is formed to a planar surface being less than or equal to 50 nm in the arithmetic average roughness Ra.

Figure 4B:
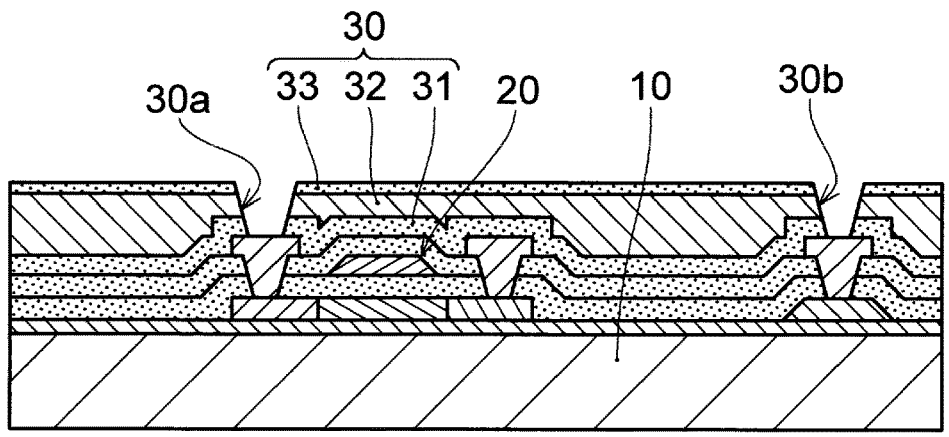
FIG. 4B shows a cross-sectional view of the process of manufacturing the organic EL display apparatus in FIG. 1 according to Example 2.

While the below-described process is the same as that in the previously-described Example 1, as shown in FIG. 4B, the contact hole 30a is formed in the planarizing layer 30. The method for forming it is the same as that according to Example 1, so that explanations thereof will be omitted.

Figure 4C:
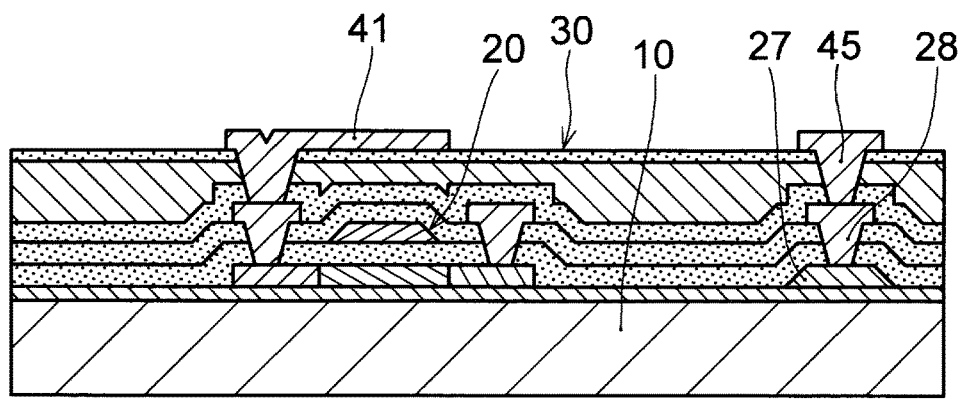
FIG. 4C shows a cross-sectional view of the process of manufacturing the organic EL display apparatus in FIG. 1 according to Example 2.

Thereafter, as shown in FIG. 4C, a metal is embedded at the interior of the contact hole 30a and the first electrode 41 for the organic light emitting element 40 is formed on the surface of the planarizing layer 30. This method is also the same as the previously-described process in FIG. 3E, so that the explanation thereof will be omitted.

Figure 4D:
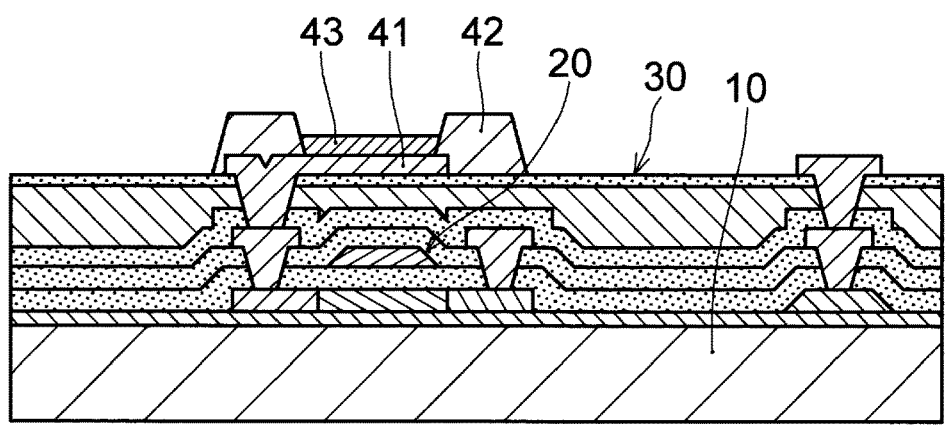
FIG. 4D shows a cross-sectional view of the process of manufacturing the organic EL display apparatus in FIG. 1 according to Example 2.

Thereafter, as shown in FIG. 4D, after the insulating bank 42 is formed, the organic light emitting layer 43 is formed using a method such as vacuum vapor deposition, for example. This method is also the same as the process shown in FIG. 3F according to the previously-described Example 1, so that explanations thereof will be omitted.

Figure 4E:
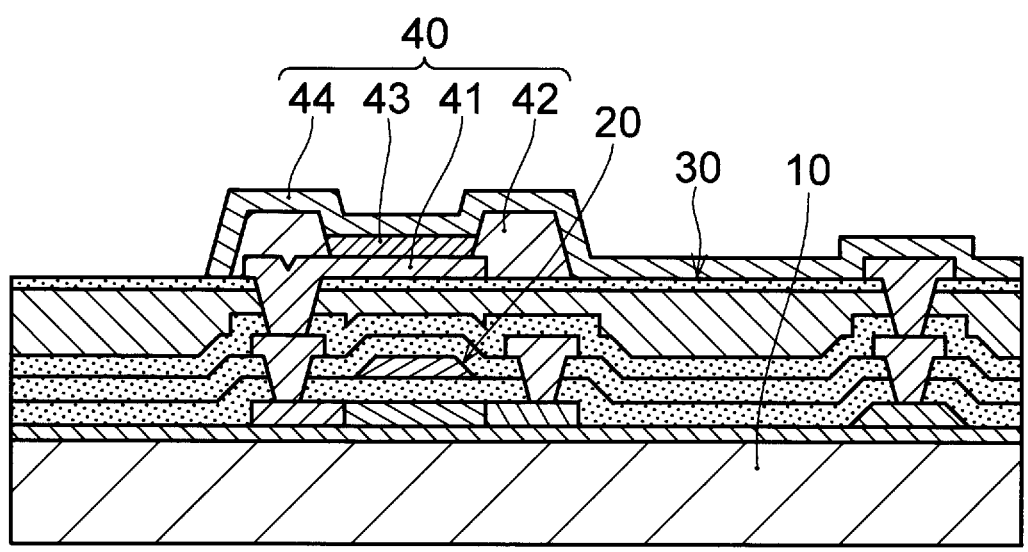
FIG. 4E shows a cross-sectional view of the process of manufacturing the organic EL display apparatus in FIG. 1 according to Example 2.

Thereafter, as shown in FIG. 4E, the second electrode 44 is formed on the entire surface. This process is also the same as the process shown in FIG. 3G according to the previously-described Example 1, so that forming can be carried out using the same method. Thereafter, forming the encapsulation layer 46 on the surface allows the organic EL display apparatus shown in FIG. 1 to be obtained.

SUMMARY (1) An organic EL display apparatus according to one embodiment of the present invention comprises: a substrate having a surface on which a drive circuit comprising a thin film transistor is formed, a planarizing layer to planarize the surface of the substrate by covering the drive circuit, and an organic light emitting element, the organic light emitting element comprising a first electrode being formed on a surface of the planarizing layer and connected to the drive circuit, an organic light emitting layer being formed on the first electrode, and a second electrode being formed on the organic light emitting layer, wherein the planarizing layer comprises a first inorganic insulating layer and an organic insulating layer, the first inorganic insulating layer and the organic insulating layer being deposited on the drive circuit, and a surface of the organic insulating layer is formed to less than or equal to 50 nm in arithmetic average roughness Ra.

According to the present embodiment, the surface of the organic insulating layer is formed to less than or equal to 50 nm in arithmetic average roughness Ra using CMP, rather than forming a first electrode of the organic insulating layer with the surface of a planarizing layer being the surface formed in the organic insulating layer as it is, and, moreover, the organic light emitting layer is formed such that it avoids a portion being immediately above a contact hole. As a result, even in the microscopically planar state, there is no unevenness and the normal direction of the surface of the organic light emitting layer of a small sub-pixel almost matches the normal direction of the display screen. As a result, the problem of light of some of small sub-pixels travelling in an oblique direction is eliminated, and factors decreasing the display quality, such as luminance non-uniformity or color non-uniformity. As a result, an organic EL display apparatus having a very good display quality is obtained.

(2) The organic insulating layer being an acrylic resin or a polyimide resin is preferable in having the heat-resisting property and resulting in a stable insulating layer.

(3) The organic insulating layer being a non-photosensitive resin is preferable in that it contains no photopolymerization initiator being easy to make the surface uneven, allowing a sufficient planarity of the surface to be obtained.

(4) The planarizing layer having a three-layer structure in which a second inorganic insulating layer is formed on the organic insulating layer is preferable in that it is easy to prevent moisture from penetrating the organic insulating layer even at the time of forming a contact hole.

(5) A contact hole being collectively formed in the three-layer structure is preferable in that the organic insulating layer is not exposed to the etching atmosphere and penetration of moisture into the organic insulating layer can be suppressed.

(6) The organic light emitting element can be made to be either structure of a bottom emission type light emitting element in which the thin film transistor is not formed at a region right below the organic light emitting layer and light is extracted from the substrate end, or a top emission type light emitting element in which the thin film transistor is formed at a region right below the organic light emitting layer and light is extracted from the second electrode. In other words, with either structure, the cause to reduce the display quality, such as luminance non-uniformity or color non-uniformity, due to the planarity of the planarizing layer is eliminated, allowing an organic EL display apparatus having a very good display quality to be obtained.

(7) A method of manufacturing an organic EL display apparatus according to another embodiment of the present invention comprises: forming a drive circuit on a substrate, the drive circuit comprising a thin film transistor (TFT); forming, on a surface of the drive circuit, a first inorganic insulating layer and an organic insulating layer; polishing a surface of the organic insulating layer by chemical mechanical polishing (CMP); forming a contact hole in the organic insulating layer and the first inorganic insulating layer, the contact hole to reach the TFT; embedding a metal at an interior of the contact hole and forming a first electrode at a given region; forming an organic light emitting layer on the first electrode; and forming a second electrode on the organic light emitting layer.

According to the present embodiment, the surface of an organic insulating layer is polished by CMP, causing the surface of a planarizing layer to be planarized even when viewed microscopically. Therefore, the color non-uniformity or luminance non-uniformity to be caused by the normal direction of the surface of the organic light emitting layer differing from the normal direction of the display surface is suppressed.

(8) A second inorganic insulating layer being formed on the organic insulating layer and the contact hole being collectively formed in a three-layer structure comprising the second inorganic insulating layer, the organic insulating layer, and the first inorganic insulating layer are preferable in not only that the process of forming a contact hole is easy, but that an organic insulating layer is protected by an inorganic insulating layer, so that penetration of moisture can be suppressed.

(9) It is preferable that the surface of the organic insulating layer is polished such that the planarity thereof is brought to greater than or equal to 20 nm and less than or equal to 50 nm in arithmetic average roughness Ra by carrying out planarizing with a neutral Ceria-based polishing material or a fumed silica-based slurry, along with water and alcohol, because the organic insulating layer can be planarly polished.

(10) The forming of the contact hole being carried out by dry etching is preferable in that etching can be carried out without producing a stepped portion even at the interface between the inorganic insulating layer and the organic insulating layer having different etching rates. When a stepped portion is produced on the interface of the inorganic insulating layer and the organic insulating layer, a metal is not sufficiently into the contact hole, making it easy to result in an increase in contact resistance.

10 Substrate
20 TFT
21 Semiconductor layer
30 Planarizing layer
31 First inorganic insulating layer
32 Organic insulating layer
33 Second inorganic insulating layer
40 Organic light emitting element
41 First electrode (anode)
43 Organic light emitting layer
44 Second electrode (cathode)

The invention claimed is:
1. An organic electroluminescent (EL) display apparatus comprising:
a substrate having a surface on which a drive circuit comprising a thin film transistor is formed, a planarizing layer to planarize the surface of the substrate by covering the drive circuit, a conductor layer being embedded into a contact hole which is formed in the planarizing layer so as to reach the thin film transistor, and an organic light emitting element, the organic light emitting element comprising a first electrode being formed on a surface of the planarizing layer and connected to the conductor layer, an organic light emitting layer being formed on the first electrode, and a second electrode being formed on the organic light emitting layer, wherein the planarizing layer comprises a first inorganic insulating layer and an organic insulating layer being formed on the first inorganic insulating layer, wherein a surface of the organic insulating layer, the surface being an opposite surface to the first inorganic insulating layer, is formed such that a planarity thereof is brought to be greater than or equal to 20 nm and less than or equal to 50 nm in arithmetic average roughness Ra, wherein each of the first electrode and the organic light emitting layer of the organic light emitting element has a surface of substantially the same degree of surface roughness as a surface roughness of the planarizing layer, and wherein the drive circuit comprising the thin film transistor is formed at an entire region right below a light emitting region of the organic light emitting layer, and the organic light emitting element is a top emission type light emitting element in which light is extracted from a second electrode end.

2. The organic EL display apparatus according to claim 1, wherein the surface of the organic insulating layer is a polished surface.

3. The organic EL display apparatus according to claim 1, wherein each of the first electrode and the organic light emitting layer of the organic light emitting element is formed such that the surface of the first electrode and the surface of the organic light emitting layer are formed, not only in substantially the same degree of surface roughness as the surface roughness of the planarizing layer, but also in substantially the same surface shape as a surface shape of the planarizing layer, thereby the organic light emitting layer being formed in a substantially uniform thickness in each of pixels.

4. The organic EL display apparatus according to claim 1, wherein the organic insulating layer is made of an acrylic resin or a polyimide resin.

5. The organic EL display apparatus according to claim 1, wherein the organic insulating layer is made of a non-photosensitive resin.

6. The organic EL display apparatus according to claim 1, wherein the planarizing layer has a three-layer structure in which a second inorganic insulating layer with substantially the same degree of surface shape and surface roughness as those of the organic insulating layer is formed on the organic insulating layer.

7. The organic EL display apparatus according to claim 1, wherein the thin film transistor is formed of an amorphous silicon layer.

8. A method of manufacturing an organic electroluminescent (EL) display apparatus, the method comprising:

forming a drive circuit on a substrate, the drive circuit comprising a thin film transistor (TFT);

forming, on a surface of the drive circuit, a first inorganic insulating layer and an organic insulating layer;

polishing a surface of the organic insulating layer such that a planarity thereof is brought to be greater than or equal to 20 nm and less than or equal to 50 nm in arithmetic average roughness Ra;

forming a contact hole in the organic insulating layer and the first inorganic insulating layer, the contact hole to reach the TFT;

embedding a metal at an interior of the contact hole and forming a first electrode continuously to the metal embedded into the contact hole at a given region in which the contact hole is not formed, on a surface of the organic insulating layer, the first electrode having substantially the same degree of surface roughness as that of the organic insulating layer;

forming an organic light emitting layer on the first electrode, the organic light emitting layer having substantially the same degree of surface roughness as that of the first electrode; and forming a second electrode on the organic light emitting layer, wherein the drive circuit comprising the thin film transistor is formed at an entire region right below a light emitting region of the organic light emitting layer, and the organic light emitting element is a top emission type light emitting element in which light is extracted from a second electrode end.

9. The method of manufacturing an organic EL display apparatus according to claim 8, wherein forming the first electrode is carried out such that a surface of the first electrode is formed, not only in substantially the same degree of surface roughness as that of the organic insulating layer, but also in substantially the same surface shape as a surface shape of the organic insulating layer by using a physical deposition, thereby the first electrode being formed in a substantially uniform thickness in each of pixels, and forming the organic light emitting layer is carried out such that a surface of the organic light emitting layer is formed, not only in substantially the same degree of surface roughness as the surface roughness of the first electrode, but also in substantially the same surface shape as a surface shape of the first electrode by using a vacuum vapor deposition, thereby the organic light emitting layer being formed in a substantially uniform thickness in each of pixels.

10. The method of manufacturing an organic EL display apparatus according to claim 8, wherein the thin film transistor is formed of an amorphous silicon layer.

11. The method of manufacturing an organic EL display apparatus according to claim 8, wherein the polishing of the surface of the organic insulating layer is carried out by chemical mechanical polishing (CMP) with a neutral Ceria-based polishing material or a fumed silica-based slurry, along with water and alcohol, thereby planarity of the surface of the organic insulating layer being brought to be greater than or equal to 20 nm and less than or equal to 50 nm in arithmetic average roughness Ra.

12. The method of manufacturing an organic EL display apparatus according to claim 8, wherein the polishing of the surface of the organic insulating layer is carried out by chemical mechanical polishing (CMP) with a neutral Ceria-based polishing material, along with water and alcohol, thereby planarity of the surface of the organic insulating layer being brought to be greater than or equal to 20 nm and less than or equal to 50 nm in arithmetic average roughness Ra.

* * * * *